United States Patent [19]

Austin

[11] 4,220,927
[45] Sep. 2, 1980

[54] ELECTRICAL SIGNAL CONVERTER USABLE IN TRIANGULAR WAVEFORM GENERATION

[75] Inventor: William R. Austin, Binghamton, N.Y.

[73] Assignee: The Singer Company, Binghamton, N.Y.

[21] Appl. No.: 898,033

[22] Filed: Apr. 20, 1978

[51] Int. Cl.² .............................................. H03K 4/10
[52] U.S. Cl. ................................... 328/181; 328/127; 307/229
[58] Field of Search ............... 328/181, 183, 184, 185, 328/127, 128; 307/DIG. 1, 237, 228, 229

[56] References Cited
U.S. PATENT DOCUMENTS 3,723,759 3/1973 Giguere .......................... 307/DIG. 1
4,121,164 10/1978 Feucht .................................. 328/181

Primary Examiner—Stanley D. Miller, Jr.
Assistant Examiner—B. P. Davis
Attorney, Agent, or Firm—J. Dennis Moore; Jeff Rothenberg

[57] ABSTRACT

A signal having instantaneous voltage values, defined by a peak-to-peak voltage magnitude and a D.C. offset voltage level, is converted into another signal having time corresponding waveform characteristics similar to the unconverted signal but having different instantaneous voltage values defined by a lesser peak-to-peak magnitude and/or another D.C. offset voltage level. This signal conversion is used by a triangle generator of the type employing an integrator, detector/control, and a switch so that triangular waveforms of any desired peak-to-peak magnitude and D.C. offset voltage level are produced independent of detector/control requirements.

2 Claims, 9 Drawing Figures

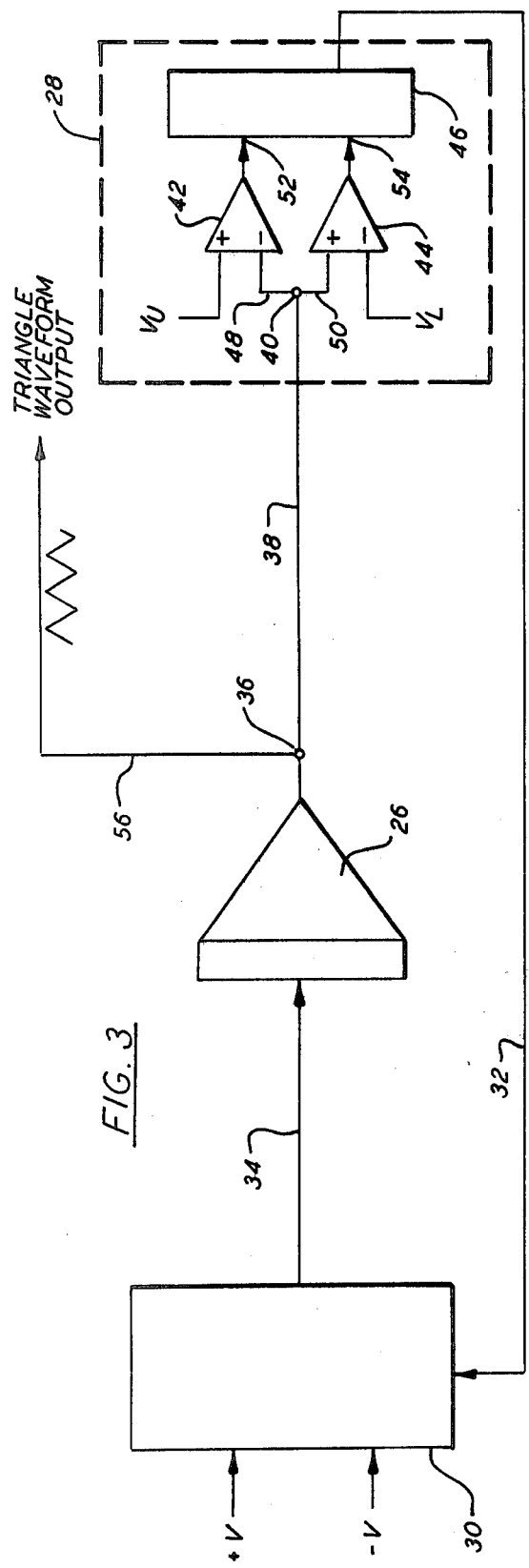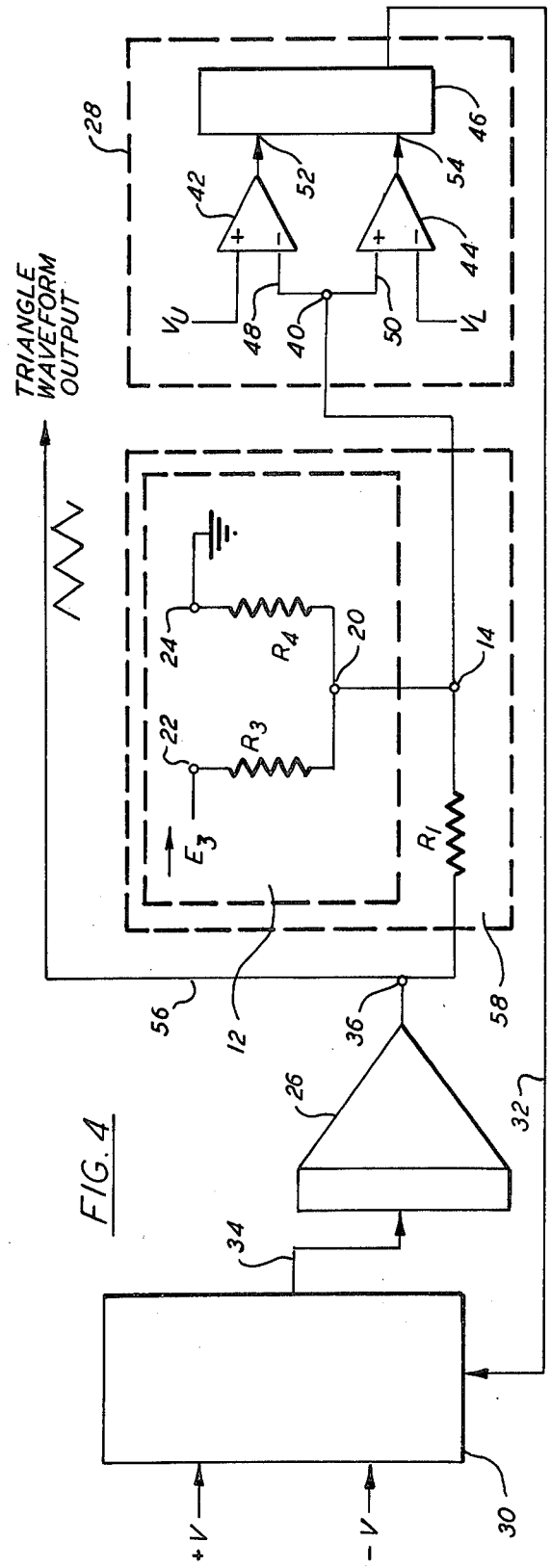

ELECTRICAL SIGNAL CONVERTER USABLE IN TRIANGULAR WAVEFORM GENERATION

BACKGROUND OF THE INVENTION

1. Field of the Invention

This invention relates to electrical signal conversion and more particularly to signal conversion used in the generation of triangular waveforms having desired peak-to-peak voltage magnitude and D.C. offset voltage level.

2. Description of the Prior Art

Use of an aircraft simulator is a modern well known method of training aircraft personnel. In a simulator the trainee is placed in a realistically recreated aircraft environment such that the trainee feels he is in and operating an actual aircraft without leaving the ground.

An important element that is used to create this realism is the aural system. During flight operation a pilot can here his environment. For instance, the engines roar and the pilot, as he pushes forward on the throttle, hears the engines strive to deliver more power. Military aircraft also have additional sounds created by combat activities, such as gunfire.

With the sounds of the real word being a combination of various audio frequencies, modulated and unmodulated, the electronic simulation of sound requires devices capable of generating various frequencies. Some modern simulators employ triangle generators in their sound generation systems. These devices are rich in harmonic frequencies and are therefore very suitable for sound system circuitry.

In order to meet sound system requirements these triangle generators must have the capability of producing signals having triangular waveforms of various peak-to-peak voltage magnitudes and various D.C. voltage offsets. The sound generation of jet engine turbine blades might require a fundamental triangle frequency symmetrical about a zero D.C. offset voltage level. The sounds of gunfire, however, might require a modulated triangle frequency which may have a different peak-to-peak voltage magnitude and a different D.C. offset voltage than that used to generate the sounds of the turbine blades.

One type of prior art triangle generator found in simulator aural systems employs an integrator, a detector/control, and a switch. The integrator receives eigher a positive or negative voltage signal from the switch and integrates this voltage generating a ramp output signal. The detector/control, which typically has pre-set peak voltage magnitudes within which it operates, senses the integrator output voltage and generates a control signal when one of the detector/control peak voltage magnitudes, an upper peak for example, is reached. This control signal is applied to the switch which then changes the signal incident to the integrator to the opposite polarity voltage, whereupon the integrator starts to generate a new ramp with a slope opposite to that of the preceding ramp. The same sequence occurs when the other peak voltage magnitude, a lower peak, is reached. A triangular waveform is thereby generated. However, this triangular waveform is limited by the peak-to-peak voltage magnitude and D.C. offset level mandated by the detector/control employed.

Typically, multiple operational amplifiers are added to the integrator network, sampling the integrator output and further processing the output waveform to achieve a different peak-to-peak magnitude and/or different offset voltage level from that mandated by the detector/control. Feedback and input resistors define the gain of the amplifiers and achieve the desired peak-to-peak magnitude. Other resistors are required to set the new offset level. The use of these additional operational amplifiers and related circuitry becomes costly, increases spatial requirements, and lowers system reliability and accuracy since each additional component contributes its own inherent errors and failure liability.

Therefore a need exists for a simple, economical method for improving triangle generators of the type employing an integrator, detector/control and a switch so that the voltage signal necessary to drive the detector/control will be independent of the desired triangular waveform produced by the integrator.

SUMMARY OF THE INVENTION

It is therefore a principal object of the present invention to provide a signal converter for converting a signal having instantaneous voltage values, defined by a peak-to-peak voltage magnitude and a D.C. offset voltage level, into another signal, having time corresponding waveform characteristics similar to the unconverted signal but having different instantaneous voltage values defined by a lesser peak-to-peak magnitude and/or another D.C. offset voltage level, both of which may be different from the peak-to-peak voltage magnitude and D.C. offset voltage level of the unconverted signal.

It is another object of the present invention to provide an improved triangle generator of the type employing an integrator, detector/control, and a switch which uses the signal converter of the present invention so that a desired voltage signal output from the integrator can be converted to the voltage signal necessary to drive the detector/control circuitry, thus allowing triangular waveforms of a desired peak-to-peak voltage magnitude and D.C. offset voltage level to be produced by the integrator without being limited by the detector/control input requirements.

According to the present invention, a first signal having first instantaneous voltage values, defined by a first peak-to-peak voltage magnitude and a first D.C. offset voltage level, is fed to an input terminal of resistance means whose resistance value is essentially directly proportional to the first peak-to-peak voltage magnitude and inversely proportional to the required second peak-to-peak voltage magnitude. The current at the output terminal of the resistance means is then controlled by a current source feeding the output terminal such that instantaneous current flow at the output terminal is made essentially equal to the summation of time-corresponding instantaneous current of the resistance means and the current flowing from the current source. The resistance means and current source form a signal converter. The signal converter interfaces both an integrator and a detector/control of a triangle generator of the type employing an integrator, detector/control and a switch. Triangular waveforms output from the integrator are used as first instantaneous voltage values. The required second peak-to-peak voltage magnitude becomes defined by the voltage requirements of the detector/control. Triangular waveforms of a desired peak-to-peak voltage magnitude and D.C. offset voltage level are then produced by the integrator independent of the detector/control input requirement. These triangular waveforms are then available for use by other circuitry, particularly those circuits in simulator sound systems driven by triangular signals.

BRIEF DESCRIPTION OF THE DRAWINGS

FIG. 3 shows a block diagram of a prior art triangle generator;

FIG. 4 shows a block diagram of an embodiment of an improved triangle generator of the present invention.

DETAILED DESCRIPTION

Electrical signal waveforms can be represented by graphs showing instantaneous voltages that represent the signal as a function of time. These waveforms can be defined also in terms of peak voltage magnitudes, peak-to-peak voltage magnitudes, and D.C. offset voltage levels.

Figure 1A:
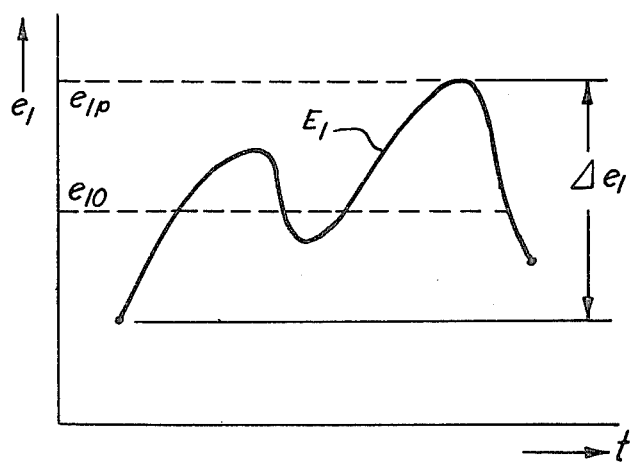
FIG. 1A, 1B, 1C and 1D are graphs showing signals employed by the present invention.

Referring to FIG. 1A a general random signal $E_1$ is shown having various instantaneous voltage means ($e_1$) for different periods of time (t). The waveform has a peak magnitude ($e_{1p}$) and a peak-to-peak magnitude ($\Delta e_1$). It also has a D.C. offset voltage level ($e_{10}$), typically the average D.C. voltage value of the signal.

Figure 1B:
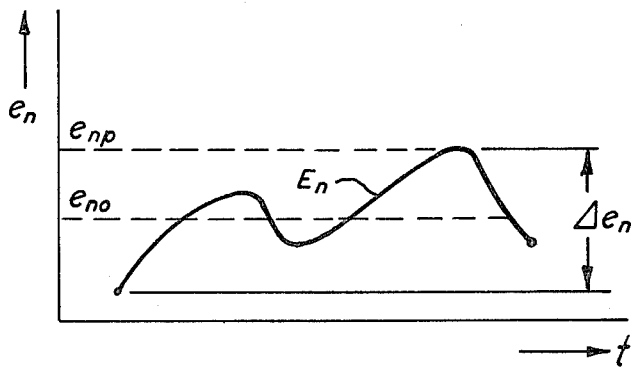

In FIG. 1B a second signal $E_n$ is shown, having time corresponding waveform characteristics similar to the signal in FIG. 1A but having second instantaneous voltage values ($e_n$), a second peak magnitude ($e_{np}$), a second peak-to-peak magnitude ($\Delta e_n$), and a second D.C. offset voltage level ($e_{no}$).

Figure 1C:
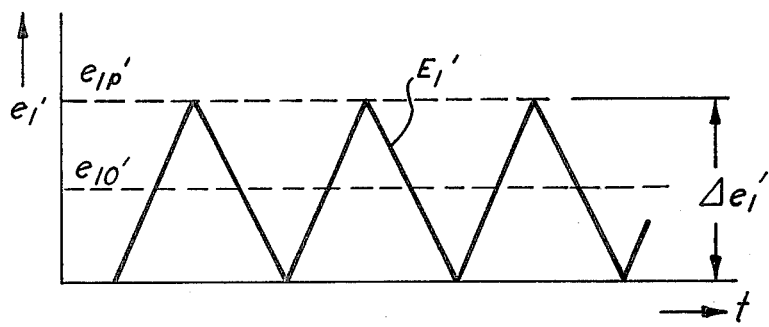

In FIG. 1C, a specific periodic triangular waveform $E_1'$ is shown having various instantaneous voltage values ($e_1'$) for different periods of time (t). The triangular waveform has a peak magnitude ($e_{1p}'$), a peak-to-peak magnitude ($\Delta e_1'$), and a D.C. offset voltage level ($e_{10}'$).

Figure 1D:
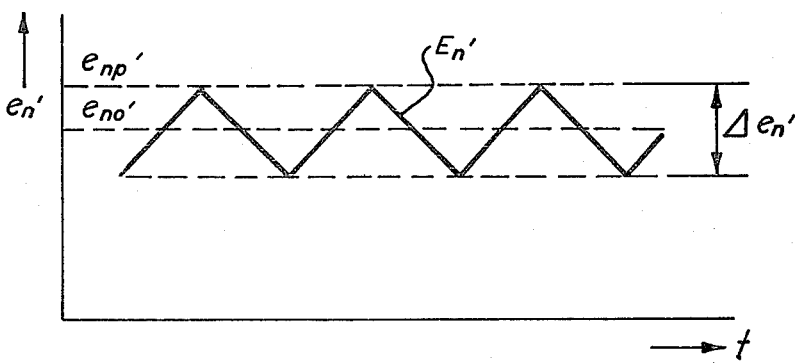

Referring to FIG. 1D, a second triangular waveform $E_n'$ is shown, having time corresponding waveform characteristics similar to that of FIG. 1C but having second instantaneous voltage values ($e_n'$), a second peak magnitude ($e_{np}'$), a second peak to peak magnitude ($\Delta e_n'$), and a second D.C. offset voltage level ($e_{no}'$).

In comparing $E_1$ and $E_1'$ signals of FIGS. 1A and 1C with their corresponding $E_n$ and $E_n'$ signals of FIGS. 1B and 1D, the value of peak magnitude, peak-to-peak magnitude, and D.C. offset level are different for the $E_1$ signal compared with the $E_n$ signal and for the $E_1'$ signal compared with the $E_n'$ signal. It becomes desirous under various circuit conditions that an $E_1$ or $E_1'$ type signal be converted into a corresponding $E_n$ or $E_n'$ type signal. According to the present invention an $E_1$ or $E_1'$ signal, hereinafter referred to as $E_1$ or $E_1'$ is converted into the corresponding $E_n$ or $E_n'$ signal, hereinafter referred to as $E_n$ or $E_n'$.

Figure 2A:
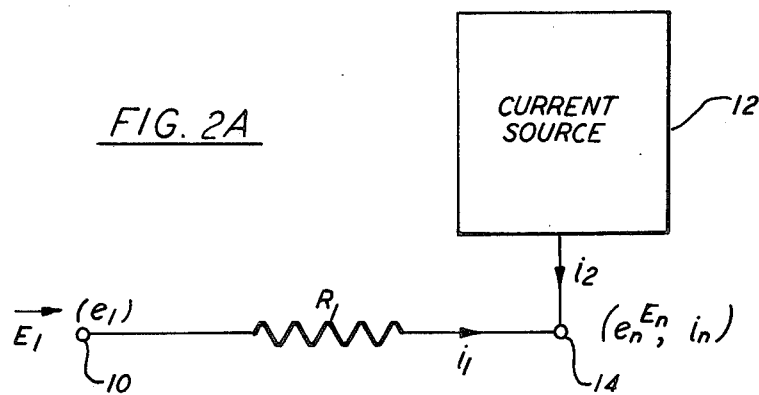
FIGS. 2A, 2B, and 2C are schematic diagrams of one aspect of the present invention.

Referring to FIG. 2A, $E_1$ is applied to one terminal 10 of resistor $R_1$. An instantaneous current $i_1$ is then developed for each corresponding instantaneous voltage $e_1$ applied. A current source 12 generates current $i_2$. Current source 12 is connected to a second terminal of $R_1$ forming junction (or node) 14. Junction 14 designates the location where $E_n$ is developed which has an instantaneous voltage $e_n$ and a corresponding instantaneous current $i_n$ related by a nodal resistance, $R_n$. The $i_n$ current flowing is therefore a summation of the current flowing in FIG. 2A from the current source 12 and the current through resistor $R_1$. The resistance value of resistor $R_1$ is set to be directly proportional to the peak-to-peak magnitude ($\Delta e_1$) of $E_1$ and inversely proportional to the peak-to-peak magnitude ($\Delta e_n$) of $E_nR_1 = e_1/e_n$. Resistor $R_1$ produces the peak-to-peak magnitude conversion from $\Delta e_1$ to $\Delta e_n$. The D.C. offset voltage level shift is then accomplished by adjusting the current source so that current flowing from the current source when combined with instantaneous current $i_1$ will produce instantaneous current $i_n$ at junction 14. As mentioned above, $i_n$ is implicity related to the desired instantaneous voltage $e_n$ by a nodal resistance, $R_n$, which in this case is the resistance value of $R_1$, and which, for simplicity, may in general be normalized to a value of one.

Figure 2B:
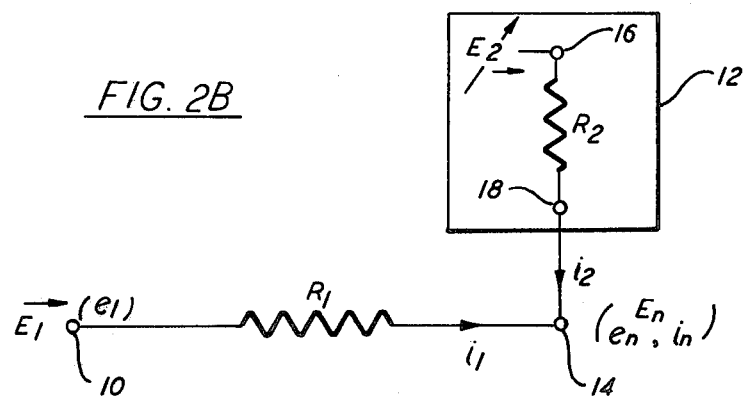
Figure 2C:
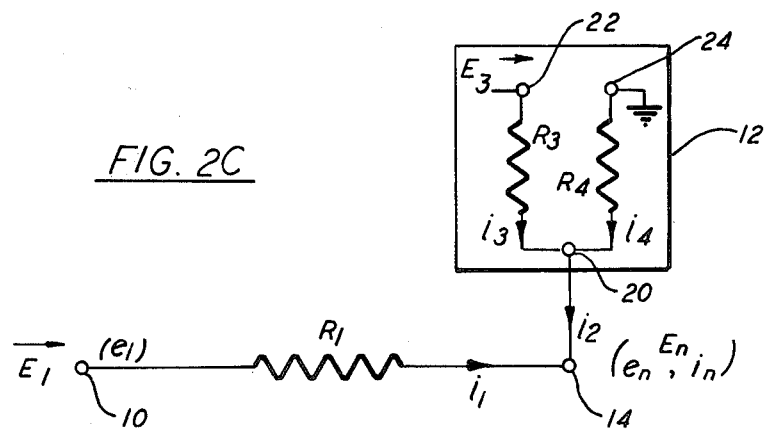

Current flow from current source 12 can be developed in various ways. FIGS. 2B and 2C show two embodiments of current source 12 as can be employed in the present invention to convert $E_1$ to $E_n$.

In FIG. 2B, resistor $R_1$ develops current $i_1$ from $E_1$ in similar fashion as shown in FIG. 2A. Current $i_2$ is produced by a variable voltage $E_2$ applied to one terminal 16 of resistor $R_2$. The second terminal 18 of resistor $R_2$ forms the output terminal of current source 12 and is connected to Resistor $R_1$ forming junction 14. The resistance value of $R_2$ is given a resistance value related to the value of resistor such that the parallel combination will result in the resistance value of $R_n$. Therefore, $R_2$ is expressed as:

$$R_2 = \frac{1}{\frac{1}{R_n} - \frac{1}{R_1}}, \text{ or } R_2 = \frac{1}{\left(1 - \frac{\Delta e_n}{\Delta e_1}\right)}$$

wherein $R_2$ is the resistance value of resistor $R_2$, $\Delta e_n$ is the peak-to-peak magnitude of $E_n$, and $\Delta e_1$ is the peak-to-peak magnitude of $E_1$. The offset voltage level can then be determined as described for FIG. 2A with the current source adjustment being accomplished by a fixed resistor and a variable voltage source. Namely, voltage $E_2$ is varied such that the current flowing through resistor $R_2$ when combined with instantaneous current $i_1$ will produce instantaneous current $i_n$ at junction 14 corresponding to the desired voltage $e_n$ across Nodal resistance $R_n$, here the parallel sum of resistors $R_1$ and $R_2$.

In FIG. 2C, resistor $R_1$ develops current $i_1$ from $E_1$ in similar fashion, as shown in FIGS. 2A and 2B. Current $i_2$ from current source 12 is produced by a summation of whatever current $i_3$ is flowing in resistor $R_3$ and whatever current $i_4$ is flowing in resistor $R_4$. The output terminals of resistors $R_3$ and $R_4$ are joined together at point 20 forming the output terminal of current source 12 which in turn is connected to resistor $R_1$ forming junction 14. A fixed voltage $E_3$ is applied to the second terminal 22 of resistor $R_3$. The second terminal 24 of resistor $R_4$ is held at a ground or reference level. When $R_4$ is held at ground potential however, current $i_4$ does not contribute to $i_n$ at junction 14, but rather serves to subtract or bleed off that portion of $i_3$ which is greater than the desired value of $i_2$. With voltage $E_3$ being a fixed value, the resistance value of $R_3$ will be directly proportional to the voltage applied to resistor $R_3$ and inversely proportional to the instantaneous current $i_n$ less the time corresponding instantaneous current $i_1$ of resistor $R_1$, or expressed mathematically as:

$$R_3 = \frac{E_3}{i_n - i_l}$$

In preferred embodiments of the present invention employing either of the circuits in FIGS. 2B or 2C, the instantaneous current values will be defined in terms of peak values of instantaneous current. These peak current values can easily be determined knowing the peak voltage magnitudes and the resistance value relating the voltage and current. In the general case:

$$i_p = e_p/R$$

and, for example, in specific cases:

$$i_{np} = e_{np}/R_n;\ i_{1p} = e_{1p}/R_1;$$

where $e_{1p}$ is the peak voltage of $E_1$, $i_{1p}$ is peak current of current $i_1$ and $R_1$ is the resistance value of resistor $R_1$; and where $e_{np}$ is the peak voltage of $E_n$, $i_{np}$ is the peak current of $i_n$ and $R_n$ is the Nodal resistance of the junction where $e_n$ is developed. Thus, $$R_3 = \frac{E_3}{\frac{e_{np}}{R_n} - \frac{e_{1p}}{R_1}}.$$

The resistance value $R_4$ can now be fixed knowing the desired instantaneous voltages $e_n$ and the fact that the instantaneous current $i_n$ flowing at junction 14 is related to the instantaneous voltage $e_n$ by nodal resistance, $R_n$, which in this case is the parallel sum of resisters $R_1$, $R_3$ and $R_4$, or:

$$i_n = \frac{e_n}{\left(\frac{1}{\frac{1}{R_1} + \frac{1}{R_3} + \frac{1}{R_4}}\right)}.$$

Since the ratio $e_n/i_n = R_n$, $R_4$ will then be:

$$R_4 = \frac{1}{\frac{1}{R_n} - \left(\frac{1}{R_1} + \frac{1}{R_3}\right)}.$$

The signal converter described can convert a signal having instantaneous voltage values, defined by a peak-to-peak magnitude and a D.C. offset level into another desired signal, having time related waveform characteristics similar to the unconverted signal but having other instantaneous voltage values, defined by a lesser peak-to-peak magnitude and another D.C. offset voltage level. This signal converter can be readily adapted to triangle generators of the type employing an integrator, a detector control, and a switch such that when an output voltage of said integrator reaches either the upper or lower required peak voltage magnitude of the detector/control, the detector/control signals the switch to change direction of integration causing the output signal from the integrator to be a triangular waveform. When the signal converter is combined with the triangle generator, triangular waveforms of a desired peak-to-peak voltage magnitude and D.C. offset votage level can be produced by the integrator independent of the detector/control input requirements.

FIG. 3 shows a typical prior art triangle generator consisting of integrator 26, detector/control 28, and switch 30. A positive D.C. voltage, $+V$, and a negative D.C. voltage, $-V$, are applied to switch 30 by any typical voltage source. Upon a control signal generated by detector/control 28 via line 32 either $+V$ or $-V$ is output from the switch. The output voltage from the switch is fed by line 34 to integrator 26. A ramp voltage, either positive-going or negative-going depending on whether a $+V$ or a $-V$ is fed to the integrator, is produced at integrator output terminal 36. Output terminal 36 is also connected by line 38 to the input terminal 40 of detector/control 28. Detector/control 28 is of the type which will output a control signal of one magnitude when one value of input signal triggers the detector/control and will output a control signal of a different magnitude when a different value of input signal triggers the detector/control. One typical detector/control employs two identical signal comparators 42 and 44 connected to a set/reset flip flop 46. For all practical purposes each signal comparator outputs a voltage when identical signals are incident upon both its input ports. Comparator 42 has a D.C. voltage level $V_U$ applied to one input port which becomes the upper peak magnitude of the detector/control. Comparator 44 has a D.C. voltage level $V_L$ applied to one input port which becomes the lower peak magnitude of the detector/control. These $V_U$ and $V_L$ levels are typically determined and limited by maximum comparator operating levels. Input terminal 40 is then connected to both remaining ports of the comparator by lines 48 and 50. When the output from the integrator reaches either voltage value $V_U$ or $V_L$, depending on whether the generated voltage ramp is positive going or negative going, a signal will be output from that respective comparator. For instance, if the ramp from the integrator is increasing, integration will proceed until the value $V_U$ is reached. When $V_U$ is reached the two input ports of comparator 42 will have identical voltage values incident upon them and a signal will be output from the comparator to input port 52 of set/reset flip flop 46. If the ramp from the integrator was decreasing, integration will proceed until the value $V_L$ is reached. When $V_L$ is reached the two input ports of comparator 44 will have identical voltage values and a signal will be output from comparator 44 to input port 54 of set/reset flip flop 46. Flip flop 46 is a common circuit device which generates one signal when one port is excited and generates another signal when another port is excited. The flip flop signal is used to control switch 30 by line 32. Namely, when integrator output terminal 36 registers a peak voltage $V_U$ flip flop 46 will receive a signal from comparator 42 indicating that value $V_U$ has been reached. Flip flop 46 then generates a signal causing switch 30 to change from $+V$ input to $-V$ input. The integrator 26 then starts to produce a new ramp with opposite slope to the previous ramp being produced just prior to the switchover from $+V$ to $-V$. The integrator will continue to produce the new ramp until voltage value $V_L$ is reached. When value $V_L$ is reached flip flop 46 will receive a signal from comparator 44 whereby a new signal will be fed to switch 30 causing the input voltage to switch again from $-V$ to $+V$. By continual switching a triangular waveform with peak-to-peak magnitude defined by the voltage differential between $V_U$ and $V_L$ will be produced by integrator 26. Line 56 will then feed this output waveform from terminal 36 to other circuitry utilizing the triangular waveform. However, the waveform characteristics produced by this form of triangle generator are severely limited by the input requirements of the detector/control.

The peak-to-peak magnitude and D.C. voltage offset level of the triangular waveform to be used by other circuits is restricted to signal characteristics defined by the detector control. If a triangular waveform is desired having a peak-to-peak magnitude and D.C. voltage offset level different from the peak-to-peak magnitude and D.C. voltage offset level set by the detector/control, then the signal from line 56 must be further processed. This is typically accomplished by operational amplifiers and their related circuitry.

An improved triangle generator is achieved by converting the desired triangular signal output from the integrator to the signal requirements mandated by the detector/control. The signal converter of the present invention when adapted for use by the triangle generator allows the integrator output waveform to be independent of the input requirements of the detector/control.

Referring to FIG. 4, the triangle generator of FIG. 3 is shown with signal converter 58, as shown in FIG. 2C, connected between integrator terminal 36 and detector/control terminal 40, replacing line 38. The signal converter operates in the same manner as hereinbefore described. A desired integrator output, in triangular waveform similar to signal $E_1'$ of FIG. 1C will have a desired peak-to-peak magnitude $\Delta e_1'$. The required peak-to-peak voltage magnitude of detector/control 28 will have a form similar to $\Delta e_n'$. The circuit relationships relating $E_1$ with $E_n$ will then similarly relate $E_1'$ with $E_n'$. Where $E_1$ and $E_n$ define general signals, $E_1'$ and $E_n'$ will define specific periodic triangular waveforms. Resistor $R_1$ has a value essentially directly proportional to the peak-to-peak voltage magnitude of the desired triangular waveform and inversely proportional to the required peak-to-peak voltage magnitude of detector/control 28. A current source 12 consists of resistor $R_3$, which has a voltage $E_2$ applied to terminal 22, and resistor $R_4$ connected at terminal 24 to ground, with resistors $R_3$ and $R_4$ being joined to form terminal 20. Resistor values $R_3$ and $R_4$ are set as hereinbefore described such that the instantaneous current at junction 14 is essentially equal to a summation of time corresponding instantaneous current of resistor $R_1$ and current flowing from terminal 20 of current source 12. The instantaneous current at junction 14 is implicitly related to signal $E_n$ which has a peak-to-peak magnitude of $(V_U - V_L)$. It can be seen that by employing the signal converter of the present invention, triangular waveforms of a desired peak-to-peak voltage magnitude and D.C. offset voltage level are produced by the integrator without being limited by the detector/control requirements. Once $E_1'$ and $E_n'$ are defined, integrator output peak-to-peak voltage magnitude $\Delta e_1'$ is converted to the detector/control peak-to-peak voltage magnitude limitation $\Delta e_n'$. The detector/control will then signal the switch to change integration polarity based on signals having peak-to-peak voltage magnitude $\Delta e_n'$ applied to the detector/control without limiting the $\Delta e_1'$ peak-to-peak magnitude of the triangular waveform to be used by other circuitry. The D.C. offset voltage levels are also not limited by the detector/control in the same manner.

The improved triangle generator has been shown employing fixed resistors and a fixed voltage source. The current source can also use the hereinbefore described circuit having a variable voltage source applied to a fixed resistor as shown in FIG. 2B. Peak values of instantaneous current and voltage can also be employed as preferred embodiments of the triangular generator in the same manner described for the basic signal converter. It will also be apparent to those skilled in the art that various changes and modifications may be made without departing from the invention. For instance, different detector/controls may be used by the triangle generator; other resistor combinations can provide networks that define the current source and input resistance of the signal converter. The invention is, therefore, intended to cover all such changes and modifications as fall within the true spirit and scope of the invention as defined by the appended claims.

What is claimed is:

1. In a triangle waveform generator comprising an integrator, a detector/control, and a switch wherein the integrator integrates the output of the switch, and the switch is controlled by the detector/control which, in turn, provides a switch command to the switch when the integrator output voltage is at either a predetermined upper voltage limit or lower voltage limit, an improvement for controlling the peak-to-peak voltage magnitude and DC offset voltage of the integrator triangle waveform output, comprising:

(a) a first resistance, $R_1$, serially connecting the output of the integrator to the input of the detector/control;

(b) a voltage source providing a predetermined voltage, $E_3$;

(c) a second resistance, $R_3$, serially connecting the output of said voltage source to the input of the detector control; and (d) a third resistance, $R_4$, serially connecting the input of the detector/control to ground;

wherein the ratios of said resistances are determined by the following relationships:

$$R_1 = \frac{\Delta e_1}{\Delta e_n}$$

$$R_3 = \frac{E_3}{\frac{e_{np}}{R_n} - \frac{e_{lp}}{R_1}}$$

$$R_4 = \frac{1}{\frac{1}{R_n} - \left(\frac{1}{R_1} + \frac{1}{R_3}\right)},$$

where
$R_1$ = the value of said first resistance,
$R_3$ = the value of said second resistance,
$R_4$ = the value of said third resistance,
$E_3$ = the value of said voltage source,
$\Delta e_1$ = the desired peak-to-peak voltage magnitude of the integrator triangle waveform output,
$\Delta e_n$ = the difference between the predetermined upper voltage limit and lower voltage limit,
$e_{np}$ = the predetermined upper voltage limit,
$e_{lp}$ = the desired upper peak voltage of the integrator triangle waveform output, and
$R_n$ = 1.

2. In a triangle waveform generator comprising an integrator, a detector/control, and a switch wherein the integrator integrates the output of the switch, and the switch is controlled by the detector/control which, in turn, provides a switch command to the switch when the integrator output voltage is at either of a predetermined upper voltage limit or lower voltage limit, an improvement for controlling the peak-to-peak voltage magnitude and DC offset voltage of the integrator triangle waveform output, comprising:
 (a) a first resistance, $R_1$, serially connecting the output of the integrator to the input of the detector/control;
 (b) a voltage source providing a variable voltage, $E_2$; and
 (c) a second resistance, $R_2$, serially connecting the output of said voltage source to the input of the detector control;
wherein the ratio of said resistances are determined by the following relationships:

$$R_1 = \frac{\Delta e_l}{\Delta e_n}$$

$$R_2 = \frac{1}{1 - \left(\frac{\Delta e_n}{\Delta e_l}\right)},$$

where
 $R_1$ = the value of said resistance,
 $R_2$ = the value of said second resistance,
 $\Delta e_l$ = the desired peak-to-peak voltage magnitude of the integrator triangle waveform output, and
 $\Delta e_n$ = the difference between the predetermined upper voltage limit and lower voltage limit, and wherein the DC offset voltage is adjusted by varying the variable voltage, $E_2$.

* * * * *

UNITED STATES PATENT AND TRADEMARK OFFICE
CERTIFICATE OF CORRECTION

PATENT NO. : 4,220,927
DATED : September 2, 1980
INVENTOR(S) : William R. Austin It is certified that error appears in the above-identified patent and that said Letters Patent are hereby corrected as shown below:

Col. 4, line 2, delete the "R" at the end of the line and substitute therefor a period (.).

Col. 4, line 3, delete "1 = $e_1/e_n$." and substitute therefor --In equation form, $R_1 = e_1/e_n$.--.

Signed and Sealed this

Seventh Day of April 1981

[SEAL]

Attest:

RENE D. TEGTMEYER

Attesting Officer

Acting Commissioner of Patents and Trademarks